(12) United States Patent
Van Dijsseldonk et al.

(10) Patent No.: US 7,423,721 B2
(45) Date of Patent: Sep. 9, 2008

(54) LITHOGRAPHIC APPARATUS

(75) Inventors: Antonius Johannes Josephus Van Dijsseldonk, Hapert (NL); Mustafa Amhaouch, Helden Panningen (NL); Wilhelmus Josephus Box, Eksel (BE); Johannes Henricus Wilhelmus Jacobs, Eindhoven (NL); Hernes Jacobs, Eindhoven (NL); Marius Ravensbergen, Bergeijk (NL); Martinus Arnoldus Henricus Terken, Lierop (NL); Robert Gordon Livesey, West Sussex (GB); Franciscus Catharina Bernardus Marinus Van Vroonhoven, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 278 days.

(21) Appl. No.: 11/012,062

(22) Filed: Dec. 15, 2004

(65) Prior Publication Data

US 2006/0126041 A1 Jun. 15, 2006

(51) Int. Cl.
*G03B 27/42* (2006.01)
(52) U.S. Cl. .............................. 355/30; 355/53; 355/67; 355/72; 378/34; 378/35
(58) Field of Classification Search .................. 355/53, 355/73, 30, 67, 72; 378/34, 35
See application file for complete search history.

(56) References Cited

U.S. PATENT DOCUMENTS

| | | | | | |
|---|---|---|---|---|---|
| 4,622,433 | A | * | 11/1986 | Frampton | 174/539 |
| 4,851,691 | A | * | 7/1989 | Hanley | 250/492.2 |
| 5,024,747 | A | * | 6/1991 | Turner et al. | 204/298.09 |
| 5,384,804 | A | * | 1/1995 | Riedel et al. | 373/137 |
| 5,577,552 | A | * | 11/1996 | Ebinuma et al. | 165/296 |
| 5,964,630 | A | * | 10/1999 | Slusarczuk et al. | 445/25 |
| 6,339,997 | B1 | * | 1/2002 | Nakagawa et al. | 118/723 AN |
| 6,445,439 | B1 | * | 9/2002 | McCullough | 355/30 |
| 6,458,430 | B1 | * | 10/2002 | Bernstein et al. | 427/525 |
| 2003/0043357 | A1 | * | 3/2003 | Shimoda | 355/53 |
| 2004/0179178 | A1 | * | 9/2004 | Emoto | 355/53 |
| 2005/0122490 | A1 | * | 6/2005 | Luttikhuis et al. | 355/30 |

* cited by examiner

*Primary Examiner*—Della J. Rutledge
(74) *Attorney, Agent, or Firm*—Sterne, Kessler, Goldstein & Fox P.L.L.C.

(57) ABSTRACT

A vacuum operated lithographic apparatus includes a vacuum housing for providing a vacuum environment to a support constructed to support a patterning device, or a substrate table, or a projection system, or any combination thereof. An interior of the vacuum housing includes a plurality of transport circuits for transporting fluids and/or electrical signals for use in a first process mode for lithographic processing. At least one of the transport circuits is adapted to transport energy towards the interior of the vacuum housing to stimulate outgassing in the vacuum housing for use in a second process mode for bringing the lithographic apparatus into a vacuum operating condition.

29 Claims, 3 Drawing Sheets

US 7,423,721 B2

LITHOGRAPHIC APPARATUS

FIELD

The present invention relates to a lithographic apparatus, and in particular to a vacuum operated lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

In certain classes of lithographic apparatus, especially in lithographic apparatus operative in the EUV (extreme ultraviolet) area of the electromagnetic spectrum, a desire exists to carry out the lithographic process in vacuum conditions to optimize and/or enable process conditions for the lithographic process. To this end, large parts of the apparatus are contained in a vacuum housing that is subject to vacuum pressure. In this housing, the lithographic process is carried out, specifically, the substrate is irradiated in a vacuum environment. While a substantial amount of equipment is often needed to carry out this lithographic process, specifically, at least one of a support constructed to support a patterning device, the patterning device being capable of imparting a radiation beam with a pattern in its cross-section to form a patterned radiation beam, a substrate table constructed to hold a substrate, and a projection system configured to project the patterned radiation beam onto a target portion of the substrate, in a vacuum environment, a desire exists to keep the parts exposed to vacuum pressure levels to a minimum. Indeed, the larger the exposed vacuum surface area is, the larger is risk of entrapping contaminants, such as water particles or hydrocarbons. In particular, water has a tendency to stick to surfaces and is often difficult to evacuate. The presence of such contaminants may cause serious shortening of performance and service lifetime of machine parts, and optical elements in particular.

However, the nature of these apparatus is such that it is difficult to reduce the effective area of surfaces exposed to the vacuum environment because of numerous other constraints. For example, because of image resolution requirements, a variety of telemetry and sensor elements are present that cannot easily be reduced or prepared for vacuum conditions. Also, in vacuum lithographic environments, various parts of the machine may be subject to different vacuum regimes, where it is also possible that a controlled leakage of service gases, for example, for creating a optimal lithographic process conditions, be present.

All these factors may contribute to serious challenges for bringing the lithographic apparatus into a vacuum operating condition. One of the main challenges is to bring the downtime of such machines to a minimum, in order to reduce costs. A conventional approach to achieve this is to heat the vacuum housing of the machine in which the lithographic apparatus is housed, in particular, the substrate table and/or the projection system. Furthermore, in order to minimize vacuum exposed areas, the tendency is to position heating elements outside the housing and to "bake-out" the vacuum exposed parts in the preparation process of bringing the lithographic apparatus into vacuum operating condition.

SUMMARY

It is desirable to provide a vacuum operated lithographic apparatus in which downtime problems may be further minimized and in which an effective area of vacuum exposed parts of the lithographic apparatus is kept to a minimum.

In an embodiment, there is provided a vacuum operated lithographic apparatus. The apparatus includes a support constructed to support a patterning device. The patterning device is capable of imparting a radiation beam with a pattern in its cross-section to form a patterned radiation beam. The apparatus also includes a substrate table constructed to hold a substrate, a projection system configured to project the patterned radiation beam onto a target portion of the substrate, and a vacuum housing for providing a vacuum environment to the support, or the substrate table, or the projection system, or any combination thereof. An interior of the vacuum housing includes a plurality of transport circuits for transporting fluids and/or electrical signals for use in a first process mode for lithographic processing. At least one of the transport circuits is adapted to transport energy towards the interior of the vacuum housing to stimulate outgassing in the vacuum housing for use in a second process mode for bringing the lithographic apparatus into a vacuum operating condition.

The invention provides an elegant solution to the "bake-out" problem by using mainly already present transport circuits in an alternative way to transport energy towards the interior of the vacuum housing.

In an embodiment, there is provided a method of preparing a vacuum lithographic apparatus for vacuum process conditions. The apparatus includes a vacuum housing for providing a vacuum environment to a substrate table and/or to a projection system. The method includes transporting energy via a transport circuit towards an interior of the vacuum housing to stimulate outgassing in the vacuum housing during a process mode for bringing the vacuum housing into a vacuum operating condition.

In an embodiment, there is provided a lithographic apparatus vacuum housing for providing a vacuum environment to a component within a lithographic apparatus. The vacuum housing includes a plurality of transport circuits for transporting fluids and/or electrical signals for use in a first process mode for lithographic processing. At least one of the transport circuits is adapted to transport energy towards an interior of the vacuum housing for use in a second process mode for bringing the lithographic apparatus into a vacuum operating condition.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
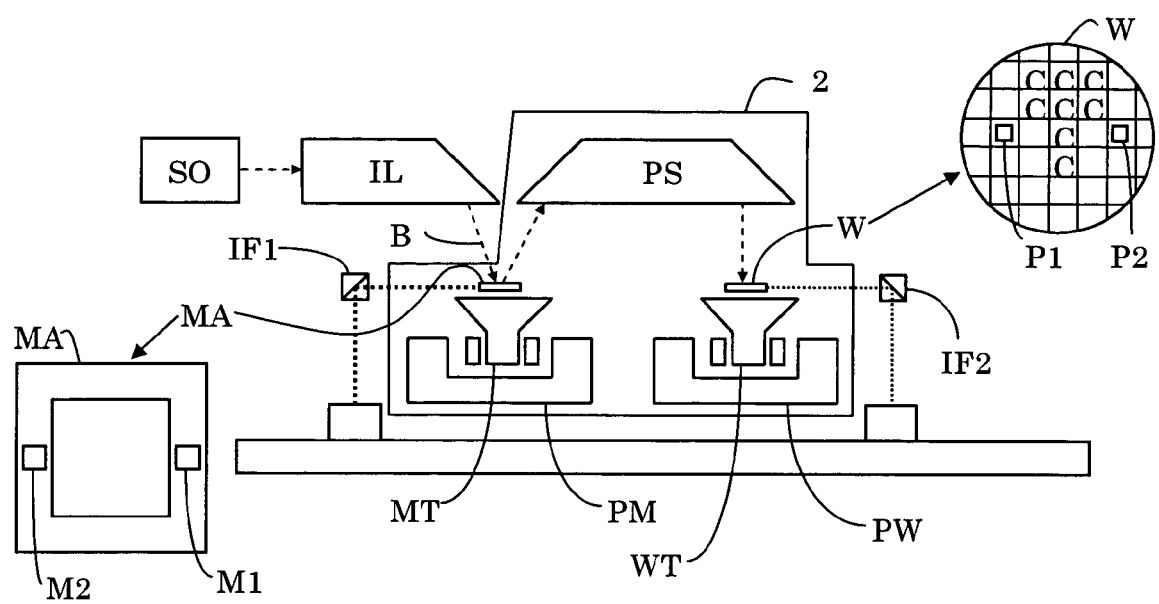
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device in a manner that depends on the orientation of the patterning device, the design of the lithographic apparatus, and other conditions, such as, for example, whether or not the patterning device is held in a vacuum environment. The support structure MT may use mechanical, vacuum, electrostatic or other clamping techniques to hold the patterning device MA. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well-known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion fluid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a fluid having a relatively high refractive index, e.g. water, so as to fill a space between the projection system and the substrate. An immersion fluid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in fluid, but rather only means that fluid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be an integral part of the lithographic apparatus, for example, when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IFI can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following example modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary while holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
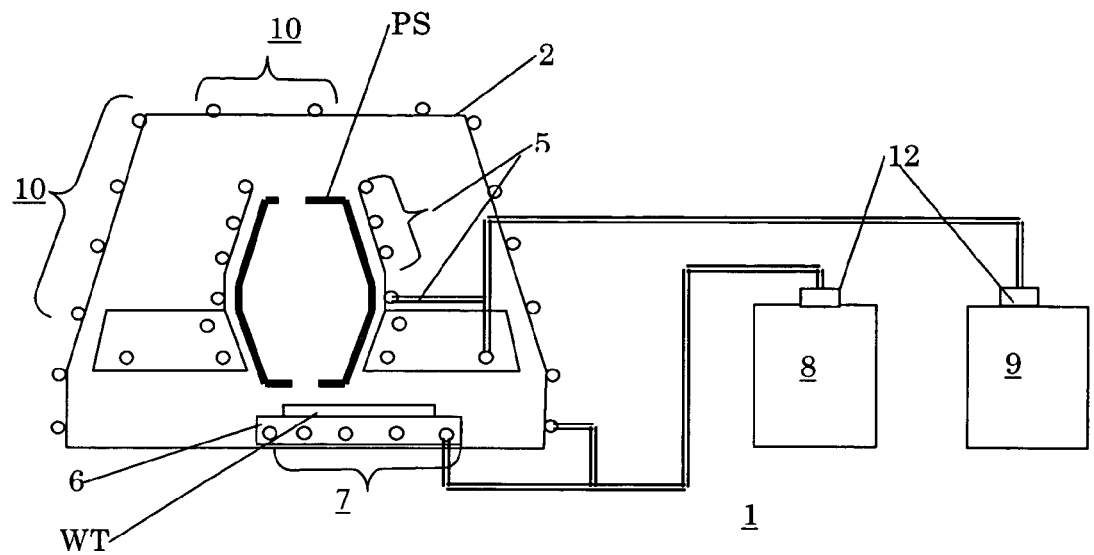
FIG. 2 is a more detailed view of part of the lithographic apparatus of FIG. 1, operative in a first process mode.

FIG. 2 shows a first embodiment of the invention in which a vacuum lithographic apparatus 1 is operated. In a first process mode, the vacuum lithographic apparatus 1 is active in a normal lithographic process mode, where a lithographic process is carried out in vacuum operating conditions. In this respect, the term vacuum refers to the normal vacuum pressure ranges that are used, which are pressures at least considerably lower than atmospheric pressure. In these vacuum conditions, at least the partial pressures of contaminants should be kept to an absolute minimum; for example, an indicative pressure for water is less than $10^{-5}$ Pa, and for hydrocarbons is even as little as less than $10^{-7}$ Pa. For providing such a vacuum environment, a vacuum housing 2 is provided and at least the support (not illustrated in FIG. 2), or the substrate table WT, or the projection system PS, or any combination thereof, are kept in vacuum conditions. In this respect, it is noted that subsections of this vacuum environment may be subject to other vacuum conditions, or may be altogether sealed off from the vacuum environment provided by housing 2. In this normal lithographic process mode illustrated in FIG. 2, a variety of subsystems are kept stable, in particular, thermally stable, for providing optimum process conditions. To this end, the projection optical system PS is provided with a coolant circuit 5, and also the substrate table WT, in particular, the stage 6 carrying the substrate table, is cooled by another coolant circuit 7. Generally, these circuits are separated since the amount of thermal energy generated in these various sections may differ. For example, the amount of energy generated in the stage 6 is often larger than the amount of energy generated in the projection optical system, in particular, in the mirrors present therein. Also, the stability requirements of various subsections may differ, thereby leading to different heat exchange units 8, 9 having differing heat exchanging characteristics. Furthermore, to provide a barrier against temperature fluctuations from the outside, the entire housing 2 is cooled, or more precisely, kept thermally stable by thermostabilizing fluids for stabilizing the temperature inside the housing 2. To this end, the fluids are transported in a circuit 10 that is provided near the wall of the housing 2, usually on the outside thereof.

Figure 3:
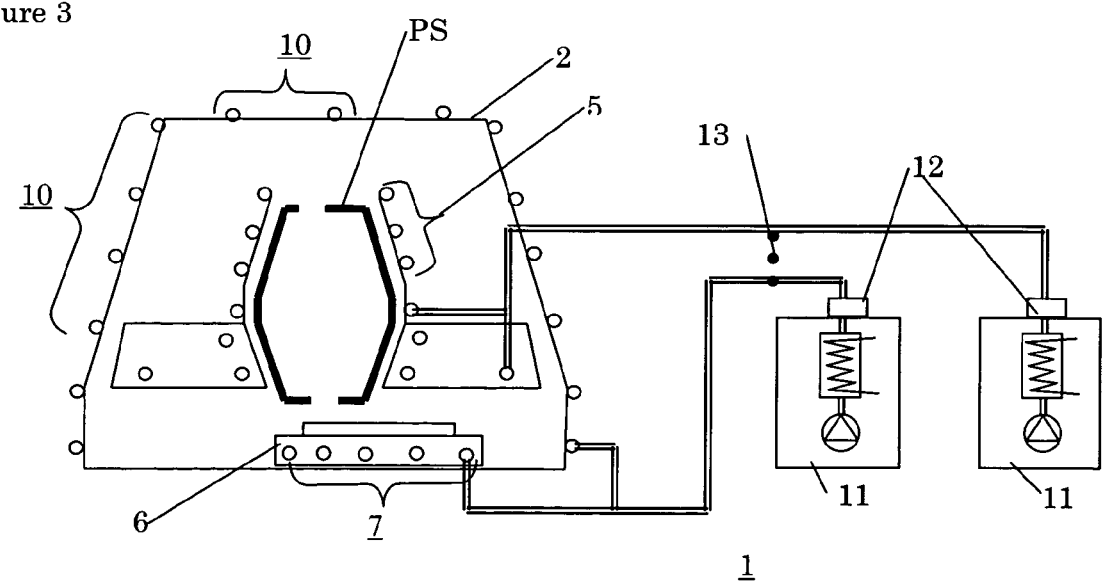
FIG. 3 is a detailed view of a lithographic apparatus according to an embodiment of the invention, operative in a second process mode for bringing the lithographic apparatus into vacuum process condition.

According to the invention as depicted in FIG. 3, in a second process mode for bringing the vacuum housing in a vacuum operating condition, instead of removing thermal energy from the lithographic system, thermal energy is transported into the interior of the vacuum housing to stimulate outgassing in the vacuum housing. Especially by using existing transport circuits 5, 7, 10, by reversing the energy flow to transport thermal energy towards the interior of the housing 2, the temperature of the lithographic system 1 may be elevated for providing bake-out conditions, while the vacuum environment is kept substantially free from additional heating elements for heating the interior of the vacuum housing 2.

In particular, a bake-out temperature lies in the range of 40-150° C., depending on particular details of the lithographic system 1. To provide such temperature elevation, heaters 11 are connected to the thermostabilizing circuits 5, 7, 10 as a temporary way to heat; alternatively, they may form an integral part of the circuits 5, 7, 10. In the illustrated example, the stage thermostabilizing circuit 7 and the circuit 10 near the wall of the housing 2 are connected. However, it will be understood that other combinations and connections are possible and fall within the scope of the invention. Normally, in the first process mode depicted in FIG. 2, a number of heat exchanging elements 8, 9 are connected to the circuit. Depending on particular details, however, in the second mode, these heat exchanging elements are better shut off from the circuit, since these are designed to provide minimal fluctuations of less than 0.5 mK/5 min, especially the heat exchangers 9 for the projection system PS are very sensitive.

The circuit used in the second process mode may seriously damage such exchange elements 8, 9. To this end, in the circuit, valve members 12 may be provided to shut off the flow towards circuit parts that are otherwise used in the first process mode. Furthermore, valve members 12 may be arranged to shut off the heat exchanging unit 8 from the circuit in the second process mode or to partly shut the circuit in the second process mode for selectively supplying energy towards the interior of the vacuum housing 2. Thus, in particular embodiments, the valves 12 may be arranged to combine or split a plurality of thermostabilizing circuits as illustrated schematically by dotted lines 13 in FIG. 2.

Furthermore, preferably, the heater units 11 are controllable to elevate the temperature in the housing in a predefined way. If the temperature is elevated too drastically, this may damage the fragile components of the projection system PS by uncontrollable thermal deformation. While conventionally, for preparing the lithographic apparatus 1 for process conditions, this bake-out process may take as much as four days, by the arrangement according to the inventive embodiment of FIG. 2, it is feasible that the bake-out time may be reduced to as little as ten hours.

Figure 4:
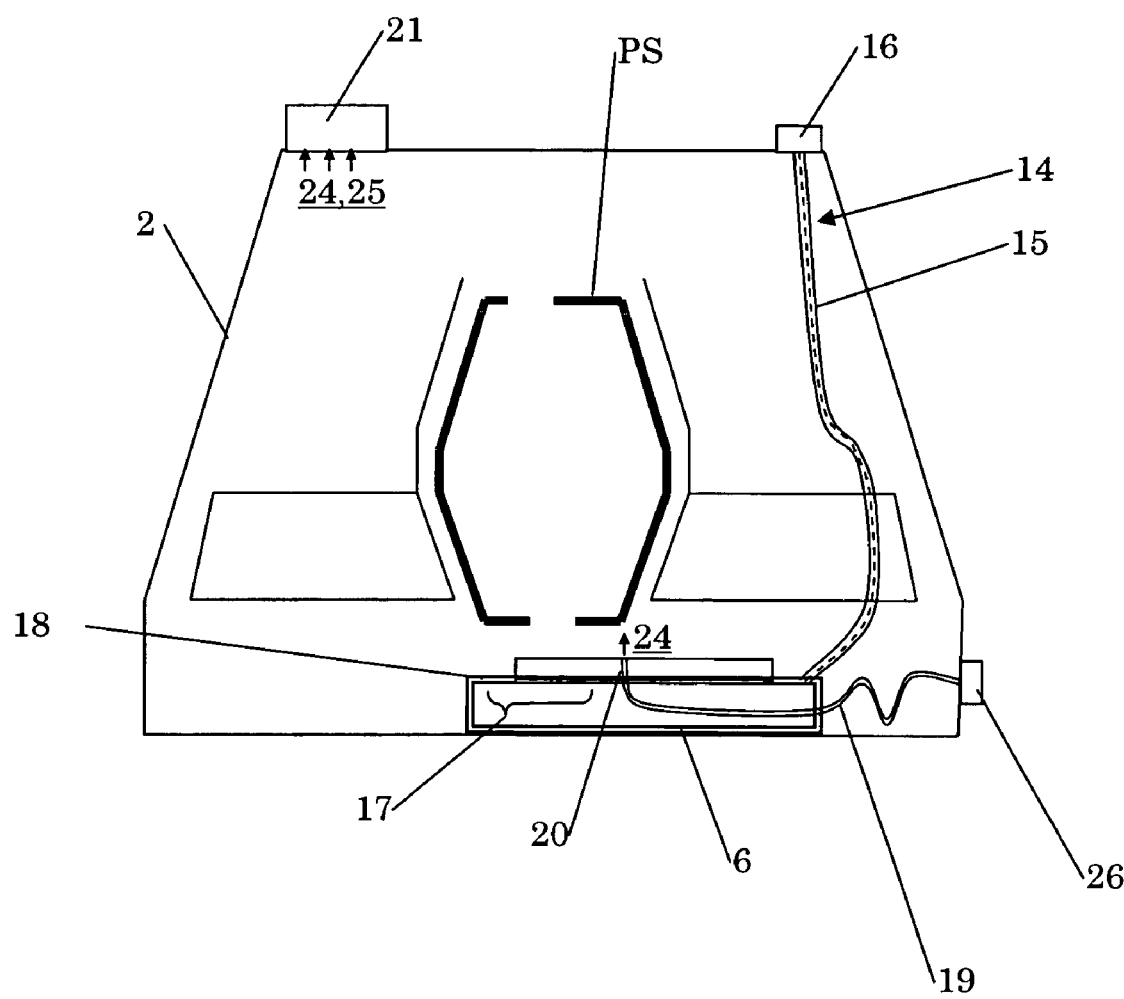
FIG. 4 depicts the lithographic apparatus of FIG. 2, showing alternative embodiments of the invention.

In a further embodiment of the invention depicted in FIG. 4, other transport circuits are adapted as well to transport energy towards the interior of the housing in order to provide accelerated bake-out for bringing the vacuum housing 2 in a vacuum operating condition. In particular, these transport circuits include an electrical circuit for generating heat to bring the vacuum housing in vacuum operating condition at a predetermined second temperature elevated with respect to the working temperature. For example, in one embodiment, the circuit includes cabling elements 14, which may be partly freely suspended in the vacuum housing 2. These cabling elements 14 may (re)absorb contaminants quickly, even after a bake-out preparatory process when some cabling is (re)mounted in the vacuum housing. Because after some preparation, the lithographic system 1 as a whole is preferably not resubject to elevated temperatures, for example, since some magnetic parts (not illustrated) may loose their magnetic properties or other damage may be done due to elevated temperatures, a problem exists of preparing the cables 14 for vacuum conditions. To this end, additional resistive elements 15 may be included in the circuit, in particular, in the cabling elements 14, which may be heated electrically. It is noted that these elements may be included in existing wiring if the presence thereof may be accounted for, or do not affect the electrical characteristics of the circuit when operative in the normal lithographic processing mode. For example, signal circuits, which only account for very limited electrical currents in the normal processing mode, may be adapted to function as heating circuits, for example, by incorporating an additional power supply and a load wire in the signal circuit. For example, in the cabling parts, a resistive load wire 15 may be present that is heated by a high frequency voltage supply 16. Other configurations include a double wire in the cabling or a single wire that uses structural parts for return currents. In still another configuration, the shielding of cable parts may be used as a conductor as well. In this embodiment also, the power supply may be controllable to elevate the temperature in the housing in a predefined way. Further the electrical circuit may include switches (not illustrated) for redefining the electrical current in the circuit in the first and second process modes. Such switches may be arranged to partly shut the electrical circuit in the second process mode for selectively supplying energy towards the interior of the vacuum housing. Also, the switches are arranged to combine or split a plurality of electric circuits. In certain embodiments, only the cabling elements 14 will be heated for bringing the lithographic apparatus 1 in process conditions. Since the heating is done local by thermoelectric elements 15, other sensitive parts of the system 1 need not be removed, which may substantially reduce down-time. Furthermore, the local heating may speed up the outgassing process of non-metal parts, in particular, plastic parts of the cable 14, so that down-time may be further reduced, and less pumping may be needed to evacuate contaminants from vacuum housing.

Another embodiment of the invention uses local heating elements 17 that are integrated in lightweight materials, for example, a carbon fiber enforced plate 18 used in the wafer stage 6 or other moving parts of the lithographic apparatus or epoxy materials that include such a circuit. Such electrical heating circuits may be used to assist the bake-out and to accelerate the process for bringing the lithographic apparatus in process conditions.

In still another embodiment of the invention depicted in FIG. 4, other forms of energy than thermal energy are used to transport energy towards the interior of the vacuum housing. In particular, in one embodiment, a gas supply circuit 19 is provided that is used for providing dry gas to supply kinetic energy to absorbents. In a preferential embodiment, the gas supply circuit 19 is operative in the first process mode for stabilizing the temperature inside the housing at a predetermined working temperature, in particular, the gas supply circuit 19 functions as a backfill gas supply circuit 20 for stabilizing a backside of substrate to be patterned in a lithographic process. Thus, in the second mode, for bringing the apparatus in vacuum operating conditions, the backfill gas circuit 20 is used to supply dry air or dry nitrogen having a partial pressure for water of less then $10^{-5}$ Pa. It is noted that this backfill gas circuit 20 is movable within the housing 2, which may provide additional benefits for defining the flow of contaminants towards a pump 21. In the (near) molecular flow regime, such dry gas may be used to provide a better definition to the exit path of contaminants towards the pump 21, which may be otherwise trapped to other surfaces present in the vacuum housing. In this respect, while bringing the apparatus to vacuum pressure, instead of only vacuum pumping, a dry gas 24 is also supplied, which may be used to provide a "rinsing" of the system 1 in a particular pumping phase of the preparation process mode. After the system 1 has been rinsed for a while, to remove further contaminants 25, the dry gas supply 26 may be stopped, after which the system may be brought more easily to the desired vacuum pressure level.

Likewise, as in the embodiments explained above, in the gas supply embodiment, the gas circuit 19 may include valve members for redefining the flow of the circuit in the first and second process modes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, fluid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A vacuum operated lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate; and
a vacuum housing to provide a vacuum environment to said support, or said substrate table, or said projection system, or any combination thereof,
wherein an interior of said vacuum housing comprises a plurality of transport circuits configured to transport fluids and/or electrical signals for use in a first process mode for lithographic processing, and wherein at least one of said transport circuits is configured to transport energy towards the interior of said vacuum housing to stimulate outgassing in said vacuum housing for use in a second process mode for bringing the lithographic apparatus into a vacuum operating condition.

2. A lithographic apparatus according to claim 1, wherein said transport circuits comprise a thermostabilizing circuit operative in the first process mode to stabilize the temperature inside the housing at a certain working temperature, and operative in the second process mode to bring the vacuum housing into the vacuum operating condition at a certain second temperature that is greater than the working temperature.

3. A lithographic apparatus according to claim 2, wherein said thermostabilizing circuit comprises a thermostabilizing fluid and a heater arranged to be active in the second process mode to elevate the temperature of the fluid in the second process mode.

4. A lithographic apparatus according to claim 3, wherein said heater is controllable to elevate the temperature in said housing in a predefined way.

5. A lithographic apparatus according to claim 3, wherein said heater is arranged as a service tool that is detachable from the thermostabilizing circuit.

6. A lithographic apparatus according to claim 5, wherein said heater comprises connectors to connect to the thermostabilizing circuit, said connectors being formed from a temperature resistant material.

7. A lithographic apparatus according to claim 3, wherein said thermostabilizing circuit comprises valve members to redefine the flow of said circuit in said first and second process modes.

8. A lithographic apparatus according to claim 7 wherein said valve members are arranged to shut off the heater from the circuit in the second process mode.

9. A lithographic apparatus according to claim 7, wherein said valve members are arranged to partly shut said circuit in said second process mode to selectively supply energy towards the interior of said vacuum housing.

10. A lithographic apparatus according to claim 7, wherein said valve members are arranged to combine or split a plurality of thermostabilizing circuits.

11. A lithographic apparatus according to claim 1, wherein said transport circuits comprise a gas supply circuit operative in the second mode to bring the vacuum housing in vacuum operating condition by providing dry gas to supply kinetic energy to adsorbents.

12. A lithographic apparatus according to claim 11 wherein said gas supply circuit is operative in the first process mode to prevent conduction of contaminants and/or to create a protective environment for optics and/or to stabilize the temperature inside the housing at a certain working temperature.

13. A lithographic apparatus according to claim 12, wherein said gas supply circuit is a backfill gas supply circuit to stabilize a backside of the substrate.

14. A lithographic apparatus according to claim 11, wherein said gas supply circuit supplies in the second operating mode dry air or dry nitrogen having a partial pressure for water of less than $10^{-5}$ Pa.

15. A lithographic apparatus according to claim 11, wherein said gas supply circuit comprises valve members to redefine the flow of said circuit in said first and second process modes.

16. A lithographic apparatus according to claim 1, wherein said transport circuits comprise an electrical circuit operative in the second process mode to generate heat to bring the vacuum housing in vacuum operating condition to a certain second temperature that is greater than a working temperature in the first process mode.

17. A lithographic apparatus according to claim 16, wherein said electrical circuit is operative in the first process mode to transport electronic signals.

18. A lithographic apparatus according to claim 16, wherein said electrical circuit comprises a power supply and a load wire.

19. A lithographic apparatus according to claim 18, wherein said power supply comprises a high frequency voltage supply.

20. A lithographic apparatus according to claim 18, wherein said power supply is controllable to elevate the temperature in said housing in a predefined way.

21. A lithographic apparatus according to claim 16, wherein said electrical circuit comprises switches to redefine the electrical current in said circuit in said first and second process modes.

22. A lithographic apparatus according to claim 21, wherein said switches are arranged to partly shut said electrical circuit in said second process mode to selectively supply energy towards the interior of said vacuum housing.

23. A lithographic apparatus according to claim 21, wherein said switches are arranged to combine or split a plurality of electric circuits.

24. A lithographic apparatus according to claim 16, wherein said circuit is comprised in a cabling element suspended in the vacuum housing.

25. A method of preparing a vacuum lithographic apparatus for vacuum process conditions, said apparatus comprising a vacuum housing for providing a vacuum environment to a substrate table and/or to a projection system, the method comprising transporting energy via a transport circuit towards an interior of said vacuum housing to stimulate outgassing in said vacuum housing during a process mode for bringing the vacuum housing into a vacuum operating condition.

26. A method according to claim 25, wherein said transport circuit is configured to transport said energy to selected parts of the lithographic apparatus.

27. A method according to claim 25, wherein said selected parts comprise cabling parts and/or non-metal parts.

28. A method according to claim 27, wherein said non-metal parts comprise fiber reinforced materials.

29. A lithographic apparatus vacuum housing to provide a vacuum environment to a component within a lithographic apparatus, said vacuum housing comprising a plurality of transport circuits configured to transport fluids and/or electrical signals for use in a first process mode for lithographic processing, wherein at least one of said transport circuits is configured to transport energy towards an interior of said vacuum housing for use in a second process mode for bringing the lithographic apparatus into a vacuum operating condition.

* * * * *